US012759274B2

(12) United States Patent
Dong et al.

(10) Patent No.: US 12,759,274 B2
(45) Date of Patent: Oct. 13, 2026

(54) MULTI-LAYER AND MULTI-CAVITY LAMINATING MACHINE

(71) Applicant: Qinhuangdao Shengcheng Automation Equipment Co., Ltd., Qinhuangdao (CN)

(72) Inventors: Weibing Dong, Qinhuangdao (CN); Shuopeng Li, Qinhuangdao (CN); Ju Shang, Qinhuangdao (CN); Mingzhen Zhou, Qinhuangdao (CN); Yanguang Wang, Qinhuangdao (CN); Yuchen Xin, Qinhuangdao (CN); Cheng Zhang, Qinhuangdao (CN); Pengfei Zhang, Qinhuangdao (CN)

(73) Assignee: Qinhuangdao Shengcheng Automation Equipment Co., Ltd., Qinhuangdao (CN)

( * ) Notice: Subject to any disclaimer, the term of this patent is extended or adjusted under 35 U.S.C. 154(b) by 67 days.

(21) Appl. No.: 18/826,838

(22) Filed: Sep. 6, 2024

(65) Prior Publication Data

US 2024/0424779 A1 Dec. 26, 2024

Related U.S. Application Data

(63) Continuation of application No. PCT/CN2024/111663, filed on Aug. 13, 2024.

(30) Foreign Application Priority Data

Aug. 5, 2024 (CN) ........................ 202411065251.8

(51) Int. Cl.
*B32B 37/00* (2006.01)
*B32B 37/18* (2006.01)
(Continued)

(52) U.S. Cl.
CPC .......... *B32B 37/0046* (2013.01); *B32B 37/18* (2013.01); *B32B 38/18* (2013.01); *H10F 71/137* (2025.01)

(58) Field of Classification Search
CPC . Y02P 70/50; B30B 7/02; B30B 7/023; B32B 2457/12; B32B 39/00; B32B 37/0046
See application file for complete search history.

(56) References Cited

U.S. PATENT DOCUMENTS

| | | | |
|---|---|---|---|
| 2007/0193692 A1 | 8/2007 | Arafat et al. | |
| 2010/0307690 A1 | 12/2010 | Chou | |
| 2020/0009848 A1 | 1/2020 | Meckelein et al. | |

FOREIGN PATENT DOCUMENTS

| | | | |
|---|---|---|---|
| CN | 109049942 A | * 12/2018 | H10F 71/00 |
| CN | 109192820 A | * 1/2019 | H10F 19/807 |
| CN | 114834138 B | * 10/2022 | B32B 7/10 |

* cited by examiner

*Primary Examiner* — Carson Gross
(74) *Attorney, Agent, or Firm* — Hemisphere Law, PLLC

(57) ABSTRACT

A multi-layer and multi-cavity laminating machine including a multi-layer feeding device, at least two multi-layer laminating devices, and a multi-layer finished product conveying device connected in sequence is provided. The number of multi-layer laminating devices are increased, and the laminating steps are carried out step by step. After completing the first laminating step, the solar cell module can be transported to the next multi-layer laminating device, so that the next solar cell module can be transported to the previous multi-layer laminating device, thereby improving production efficiency. In the same production time, it is possible to increase the production quantity or reduce the production time by producing the same quantity of products.

4 Claims, 5 Drawing Sheets

(51) Int. Cl.

| | |
|---|---|
| ***B32B 38/18*** | (2006.01) |
| ***H10F 71/00*** | (2025.01) |

MULTI-LAYER AND MULTI-CAVITY LAMINATING MACHINE

TECHNICAL FIELD

The disclosure relates to the field of laminating machine technologies, and more specifically, to a multi-layer and multi-cavity laminating machine.

BACKGROUND

Solar cell module laminators are one of the essential pieces of equipment required for the encapsulation of solar cell modules.

However, existing laminators are mostly multi-layer single-cavity types. For example, CN114834138B discloses a fully automatic stacked multi-layer laminator, which is a multi-layer single-cavity laminator with only one multi-layer laminating device. Each layer of solar cell modules can only be transported to the multi-layer finished product conveyance device after completion of the lamination process. The following solar cell module must wait until the previous lamination be completed before it can be fed into the multi-layer feeding device, resulting in reduced production efficiency.

Therefore, there is an urgent need for those skilled in the art to provide an efficient multi-layer and multi-cavity laminator.

SUMMARY

In view of this, the disclosure provides a multi-layer and multi-cavity laminator to enhance production efficiency.

To achieve the above objective, the following technical schemes have been adopted.

A multi-layer and multi-cavity laminator is provided, which includes a multi-layer feeding device, at least two multi-layer laminating devices, and a multi-layer finished product conveyance device connected in sequence.

By adopting the above technical scheme, the following beneficial effects have been obtained.

By increasing the number of multi-layer laminating devices and carrying out the laminating steps progressively, solar cell modules can be transferred to the next multi-layer laminating device after completing the first laminating step. Consequently, the subsequent solar cell module can then be transported to the preceding multi-layer laminating device, thereby enhancing production efficiency. This allows for an increase in production volume within the same production time or reduces the production time required for the same volume of products.

Furthermore, adjacent multi-layer laminating devices are connected by a transitional conveyance device.

The beneficial effect of adopting the aforementioned further technical solution is to improve the compactness between devices and ensure continuous transportation.

Moreover, the transitional conveyance device includes a support frame and multiple conveyance roller sets, with the support frame placed between two adjacent multi-layer laminating devices; the multiple conveyance roller sets are mounted on the support frame and distributed at equal intervals from top to bottom.

Additionally, both the input end of the multi-layer feeding device and the output end of the multi-layer finished product conveyance device are equipped with lifting conveyance devices.

The beneficial effect of adopting the aforementioned further technical solution is to realize automatic layered loading or unloading, thus improving work efficiency.

Furthermore, the lifting conveyance device includes a lift, two lift frames, and two belt conveyor bodies. The two lift frames are mounted on the lift and are parallelly distributed vertically. The two belt conveyor bodies are respectively installed on the top of the two lift frames.

Further, the number of multi-layer laminating devices is two or three.

BRIEF DESCRIPTION OF THE DRAWINGS

To more clearly illustrate the technical solutions in the embodiments of the present disclosure or existing technologies, a brief introduction to the drawings required for the descriptions of the embodiments or existing technologies will be provided. It is evident that the drawings described below are merely examples of the present invention. For those skilled in the art, other drawings can be derived from the provided figures without creative efforts.

DETAILED DESCRIPTION OF THE EMBODIMENTS

The following description will clearly and completely detail the technical solutions of the embodiments of the present invention in conjunction with the drawings provided in these embodiments. It is evident that the described embodiments are only a portion of all possible embodiments and not the entirety. All other embodiments acquired by those skilled in the art without creative efforts, based on the embodiments of the present invention, fall within the scope of protection of this invention.

Embodiment 1

Figure 1:
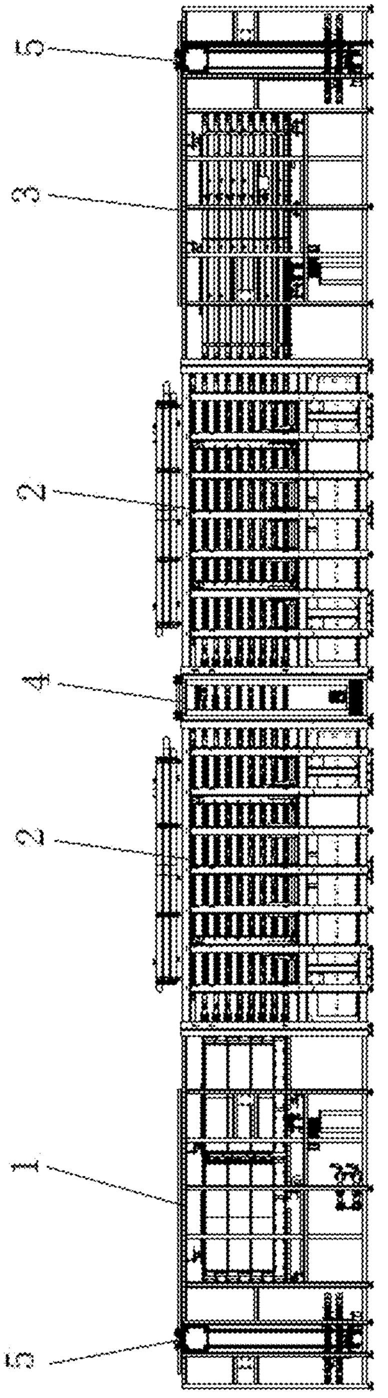
FIG. 1 is a structural schematic diagram of a multi-layer and multi-cavity laminator as provided in the first embodiment of the disclosure.
Figure 3:
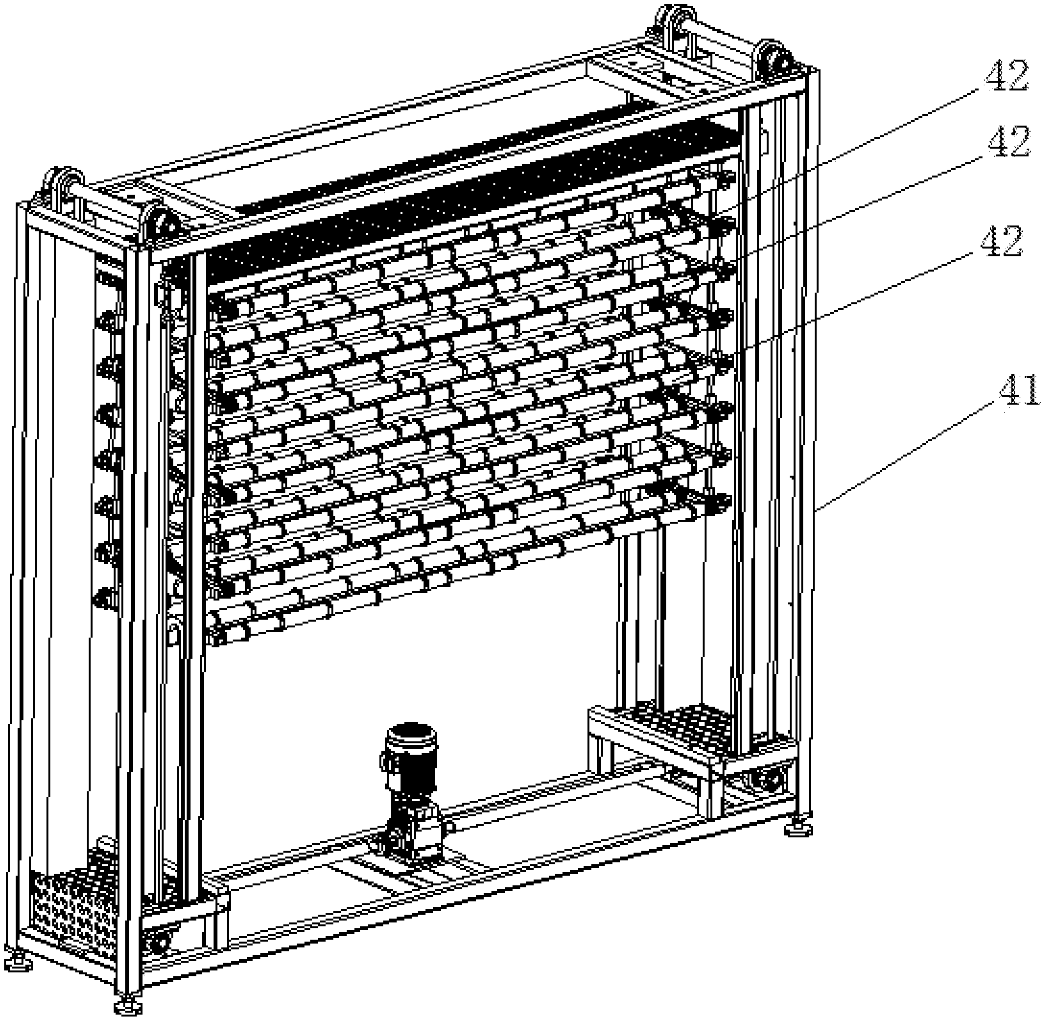
FIG. 3 is a structural schematic diagram of the transitional conveyance device of the disclosure.
Figure 4:
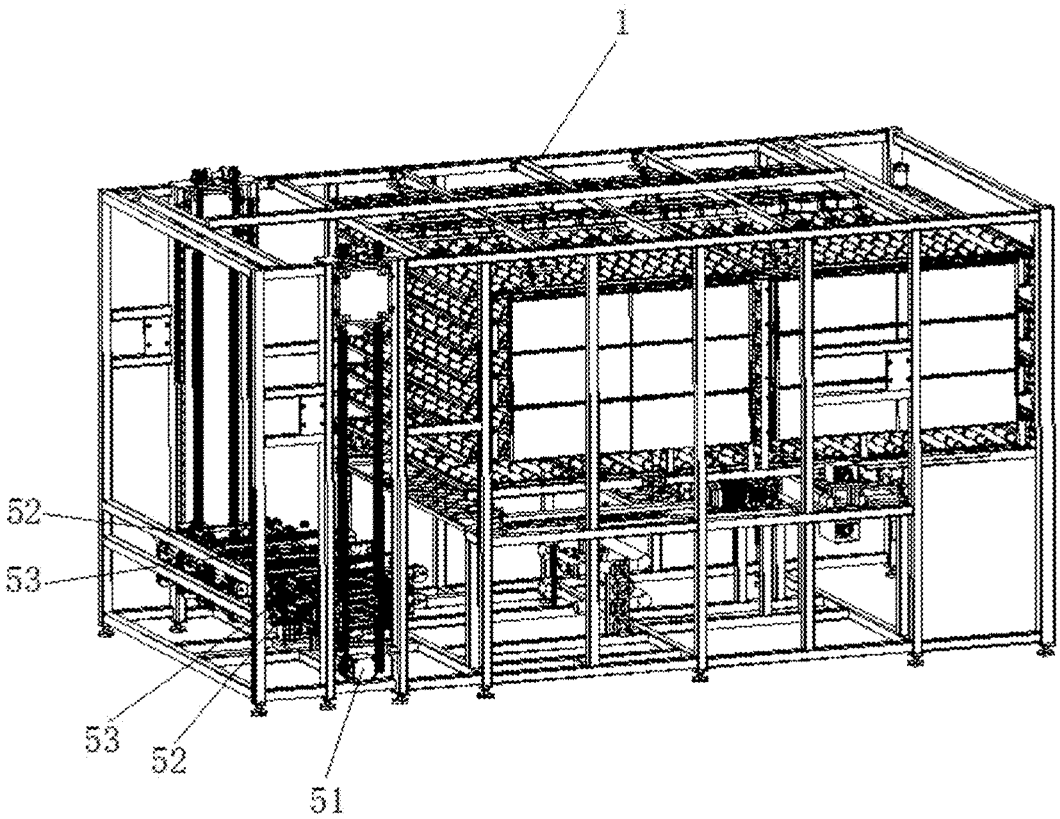
FIG. 4 is a structural schematic diagram of the lifting conveyance device and multi-layer feeding device of the disclosure.
Figure 5:
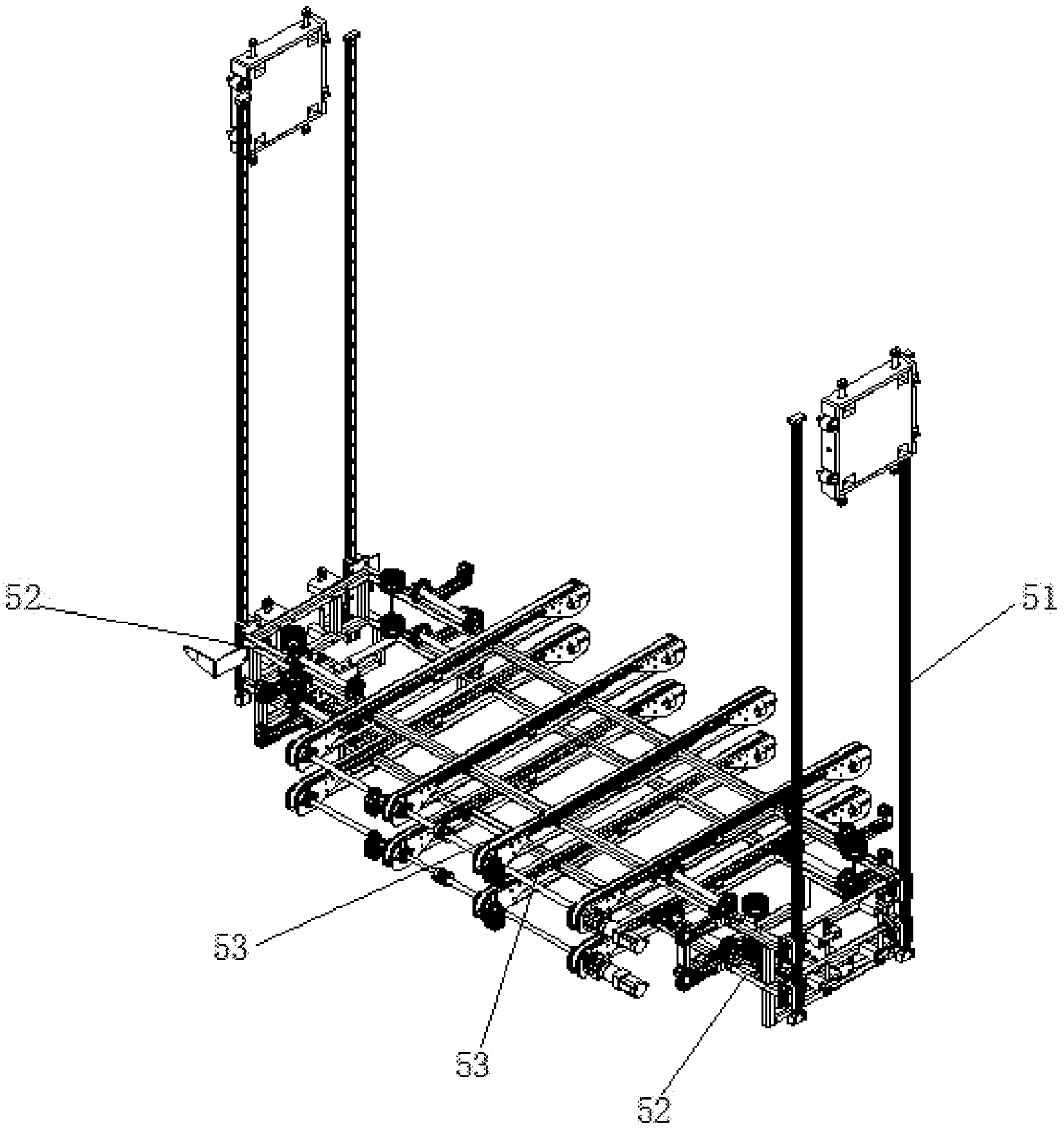
FIG. 5 is a partial structural schematic diagram of the lifting conveyance device provided by the disclosure.

As shown in the FIGS. 1, 3, 4, and 5, a multi-layer and multi-cavity laminator including a multi-layer feeding device 1, at least two multi-layer laminating devices 2, and a multi-layer finished product conveyance device 3 connected in sequence is provided. In this embodiment, there are two multi-layer laminating devices 2. The structures of the multi-layer feeding device 1, multi-layer laminating devices 2, and multi-layer finished product conveyance device 3 are identical to those of an automatic stacked multi-layer laminator disclosed in CN114834138B and will not be elaborated herein. By increasing the number of multi-layer laminating devices 2, the lamination steps are carried out progressively. After completing the first lamination step, the solar cell module can be transferred to the next multi-layer laminating device 2, allowing the subsequent solar cell module to then be transported to the preceding multi-layer laminating device 2, thereby enhancing production efficiency. This allows for an increase in production volume within the same production time or reduces the production time required for the same volume of products.

To further optimize the technical solution of the present invention, adjacent multi-layer laminating devices 2 are connected by a transitional conveyance device 4, improving the compactness between devices and ensuring continuous transportation.

Specifically, the transitional conveyance device 4 includes a support frame 41 and multiple conveyor roller groups 42. The support frame 41 is placed between two adjacent multi-layer laminating devices 2. Multiple conveyor roller groups 42 are installed on the support frame 41 and distributed from top to bottom at equal intervals. It is evident that the multiple conveyor rollers of the conveyor roller group 42 can be connected through chain drive and driven by a single motor.

To further optimize the technical solution of the present invention, both the input end of the multi-layer feeding device 1 and the output end of the multi-layer finished product conveyance device 3 are equipped with lifting conveyance devices 5 to achieve automatic layered loading or unloading, thus improving work efficiency.

Specifically, the lifting conveyance device 5 includes a lift 51, two lift frames 52, and two belt conveyor bodies 53. Both lift frames 52 are installed on the lift 51 and are parallelly distributed vertically. The two belt conveyor bodies 53 are respectively mounted on the top of the two lift frames 52. In this embodiment, the belt conveyor body 53 specifically refers to the part of the belt conveyor excluding its frame.

Embodiment 2

Figure 2:
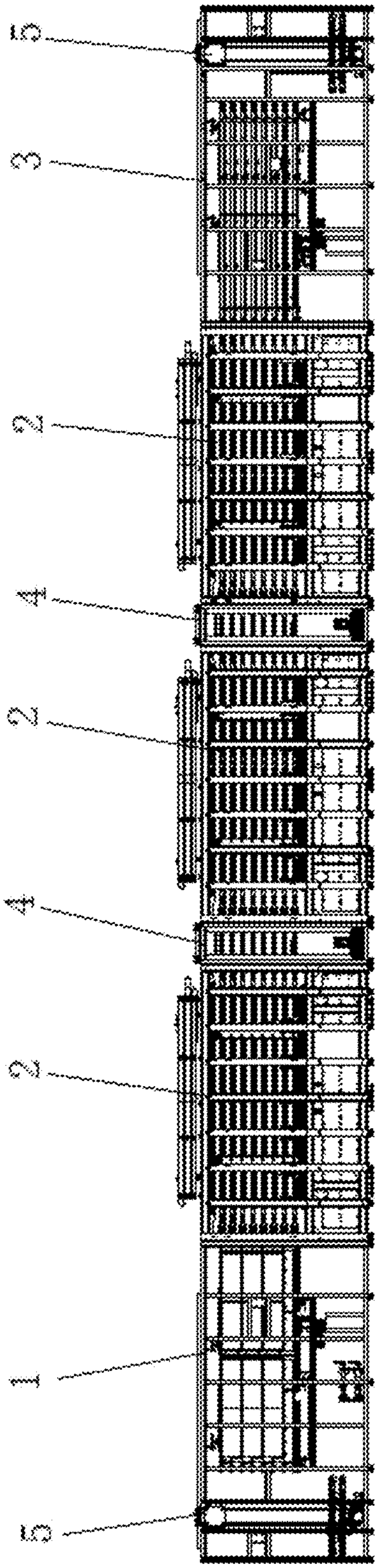
FIG. 2 is a structural schematic diagram of a multi-layer and multi-cavity laminator as provided in the second embodiment of the disclosure.

As shown in FIGS. 2, 3, 4, and 5, this embodiment of the invention discloses a multi-layer and multi-cavity laminator including a multi-layer feeding device 1, at least two multi-layer laminating devices 2, and a multi-layer finished product conveyance device 3 connected in sequence. In this embodiment, there are three multi-layer laminating devices 2. The structures of the multi-layer feeding device 1, multi-layer laminating devices 2, and multi-layer finished product conveyance device 3 are identical to those of an automatic stacked multi-layer laminator disclosed in CN114834138B and will not be elaborated herein. By increasing the number of multi-layer laminating devices 2, the lamination steps are carried out progressively. After completing the first lamination step, the solar cell module can be transferred to the next multi-layer laminating device 2, allowing the subsequent solar cell module to then be transported to the preceding multi-layer laminating device 2, thereby enhancing production efficiency. This allows for an increase in production volume within the same production time or reduces the production time required for the same volume of products.

To further optimize the technical solution of the present invention, adjacent multi-layer laminating devices 2 are connected by a transitional conveyance device 4, improving the compactness between devices and ensuring continuous transportation.

Specifically, the transitional conveyance device 4 includes a support frame 41 and multiple conveyor roller groups 42. The support frame 41 is placed between two adjacent multi-layer laminating devices 2. Multiple conveyor roller groups 42 are installed on the support frame 41 and distributed from top to bottom at equal intervals. It is evident that the multiple conveyor rollers of the conveyor roller group 42 can be connected through chain drive and driven by a single motor.

To further optimize the technical solution of the disclosure, both the input end of the multi-layer feeding device 1 and the output end of the multi-layer finished product conveyance device 3 are equipped with lifting conveyance devices 5 to achieve automatic layered loading or unloading, thus improving work efficiency.

Specifically, the lifting conveyance device 5 includes a lift 51, two lift frames 52, and two belt conveyor bodies 53. Both lift frames 52 are installed on the lift 51 and are parallelly distributed vertically. The two belt conveyor bodies 53 are respectively mounted on the top of the two lift frames 52. In this embodiment, the belt conveyor body 53 specifically refers to the part of the belt conveyor excluding its frame.

The descriptions of each embodiment in this specification are presented in a progressive manner, with each embodiment focusing on what differentiates it from the others. The similarities among the various embodiments are cross-referenced accordingly. Since the devices disclosed in the embodiments correspond to the methods disclosed therein, their descriptions are relatively brief, with relevant details referenced in the method sections.

The above explanations of the disclosed embodiments enable professionals in the field to implement or use the present invention. Numerous modifications to these embodiments will be apparent to those skilled in the art, and the general principles defined herein may be realized in other embodiments without departing from the spirit or scope of the present invention. Therefore, the present invention is not limited to the embodiments illustrated herein but is consistent with the broadest scope aligned with the principles and novel features disclosed in this document.

What is claimed is:

1. A multi-layer, multi-cavity laminating machine, comprising a multi-layer feeding device, at least two multi-layer lamination devices and a multi-layer finished product conveyance device connected in sequence, wherein each two adjacent multi-layer lamination devices are connected through a separate transitional conveyance device independently provided therebetween, and the transitional conveyance device includes a support frame and multiple conveyor roller groups; the support frame is arranged between the two adjacent multi-layer lamination devices; the multiple conveyor roller groups are installed on the support frame and distributed from top to bottom at equal intervals; and multiple conveyor rollers of each of the conveyor roller groups are connected through chain drive and driven by a single motor.

2. The multi-layer, multi-cavity laminating machine of claim 1, wherein an input end of the multi-layer feeding device and an output end of the multi-layer finished product conveyance device both are equipped with lift conveyance devices.

3. The multi-layer, multi-cavity laminating machine of claim 2, wherein the lift conveyance devices each comprises an elevator, two lifting frames, and two belt conveyor bodies; both lifting frames are installed on the elevator and are parallelly distributed vertically; the two belt conveyor bodies are respectively mounted on the top of the two lifting frames.

4. The multi-layer, multi-cavity laminating machine of claim 1, wherein the number of multi-layer lamination devices is two or three.

* * * * *